United States Patent [19]

Tanaka et al.

[11] Patent Number: 4,770,531
[45] Date of Patent: Sep. 13, 1988

[54] STAGE DEVICE WITH LEVELLING MECHANISM

[75] Inventors: Hiroshi Tanaka; Yukio Kakizaki, both of Yokohama, Japan

[73] Assignee: Nippon Kogaku K. K., Tokyo, Japan

[21] Appl. No.: 51,514

[22] Filed: May 19, 1987

[30] Foreign Application Priority Data

May 23, 1986 [JP] Japan .................................. 61-118832

[51] Int. Cl.[4] ............................................. G01B 11/00
[52] U.S. Cl. ...................................... 356/358; 33/1 M; 355/53; 356/138; 356/363; 356/401
[58] Field of Search .............. 356/138, 358, 363, 371, 356/373, 375, 400, 401; 355/53; 33/1 M

[56] References Cited

U.S. PATENT DOCUMENTS

| | | | |
|---|---|---|---|
| 4,383,757 | 5/1983 | Phillips | 355/53 |
| 4,431,304 | 2/1984 | Mayer | 355/53 X |
| 4,504,144 | 3/1985 | Trost | 355/53 X |
| 4,558,949 | 12/1985 | Uehara et al. | 356/152 |
| 4,585,337 | 4/1986 | Phillips | 355/53 X |

FOREIGN PATENT DOCUMENTS 0132804 6/1986 Japan .................................. 356/358

Primary Examiner—F. L. Evans
Attorney, Agent, or Firm—Shapiro and Shapiro

[57] ABSTRACT

A stage device comprises an XY-stage movable two-dimensionally in a predetermined reference plane, a Z-stage provided on the XY-stage and capable of a vernier movement in a Z-direction substantially perpendicular to said reference plane, and a levelling stage provided on the Z-stage and capable of an arbitrary inclining movement with respect to the reference plane. There is also provided a laser interferometer for measuring the position of a stage base portion in the X- or Y-direction by projecting a light beam onto a mirror provided on the Z-stage, and the measuring axis of the interferometer is so selected as to be contained in the reference plane. The levelling stage can be inclined in an arbitrary direction with means for driving plural points of the levelling stage independently in the Z-direction. Further it is so designed that the moving points are approximately positioned on the reference plane when the driving points are in a predetermined neutral stage.

6 Claims, 2 Drawing Sheets

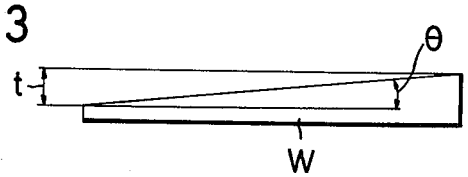
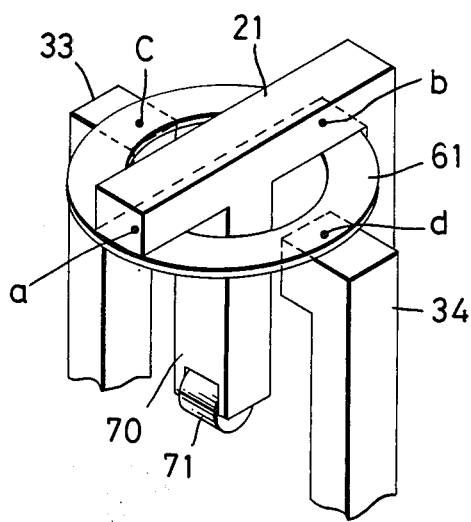
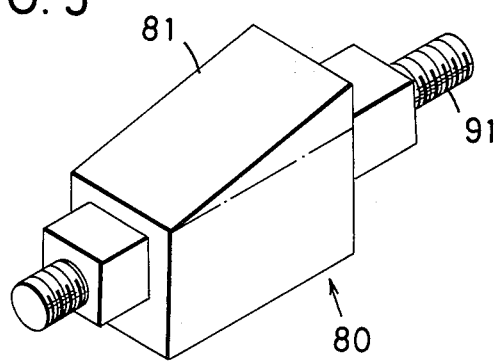

STAGE DEVICE WITH LEVELLING MECHANISM

BACKGROUND OF THE INVENTION

1. Field of the Invention

The present invention relates to a stage device for supporting and two-dimensionally moving a workpiece such as a semiconductor wafer, equipped with a mechanism for levelling said workpiece.

2. Related Background Art

A particularly important step in the process for working a semiconductor wafer is a printing step, called photolithography. There have been employed various exposure apparatus in this step, but a reduction-projection exposure apparatus, or so-called stepper, is being principally utilized in order to meet the rapid progress in the degree of integration and toward a finer line width. This apparatus projects a pattern formed on a photomask, called reticle, through a projection lens onto photoresist coated on a wafer, thereby exposing said photoresist to the light. Since the field of each exposure is smaller than the size of the wafer, the exposures are conducted by step-and-repeat process in which a stage supporting the wafer is two-dimensionally moved. In such steppers a higher resolving power is required in the projection lens year after year, and a higher numerical aperture of the lens and a larger exposure field are simultaneously desired. However a projection with a large numerical aperture and with a large exposure field is inevitably associated with a smaller depth of focus, so that the margin for exact focusing over the entire exposure field is considerably small.

The surface of the wafer to be exposed is seldom set constantly parallel to the moving plane of the wafer supporting stage, or the imaging plane of the pattern of the reticle. In fact the wafer surface may be inclined in excess of the depth of focus of the projection lens on both sides of the exposure field, due to incomplete flatness of the wafer chuck and of the wafer itself. A stepper equipped with so-called wafer levelling mechanism, for finely adjusting the inclination of wafer on the stage, in order to correct the above-mentioned inclination, is already disclosed for example in the U.S. Pat. No. 4,383,757. Such already known wafer levelling mechanism is provided with so-called through-the-lens (TTL) levelling sensor for determining the axial aberrations between the image plane and the wafer surface at the plural points in the exposure field through the projection lens and detecting the amount and direction of inclination from said aberrations, and is adapted to level the sensor based on the detection signal from said sensor.

Such conventional mechanism may however result in an alignment error (error in the registration between the projected image of the reticle pattern and the area to be exposed on the wafer) after the wafer is levelled. This is not a problem if the TTL alignment through the projection lens is conducted simultaneously with the TTL levelling, as each exposure can be achieved without the error in alignment in this manner. However the necessity of alignment for each exposure reduces the throughput. Also the TTL levelling sensors currently developed may not be ideal for such detection as they are often strongly influenced by the surface state of the wafer.

In contrast to the step-and-repeat exposure process with alignment for each exposure, there is also a process of moving the wafer stage to a position predetermined by designing after the global alignment of the wafer and conducting exposure at said position. This process can achieve a highest throughput and is suitable for the mass production of IC's such as semiconductor memories. In this process, for levelling the wafer without sacrificing the throughput, it is desirable to dispense with the alignment for each exposure. For this purpose the mechanism has to be so constructed as to avoid lateral movement of the wafer in the levelling operation after the stepping motion of the wafer stage for an exposure, but the conventional mechanisms cannot necessarily ensure the absence of such lateral movement.

SUMMARY OF THE INVENTION

The object of the present invention is to provide a stage device capable of a levelling operation without any movement of the workpiece in the direction of surface thereof.

The stage device of the present invention comprises an XY-stage movable two-dimensionally in a predetermined reference plane, a Z-stage provided on said XY-stage and capable of a vernier movement in a Z-direction substantially perpendicular to said reference plane, and a levelling stage provided on said Z-stage and capable of an arbitrary inclining movement with respect to said reference plane. There is also provided a laser interferometer for measuring the position of a stage base portion in the X- or Y-direction by projecting a light beam onto a mirror provided on the Z-stage, and the measuring axis (center of the laser beam) of said interferometer is so selected as to be contained in the reference plane. The levelling stage can be inclined in an arbitrary direction with means for driving plural points of the levelling stage (for example three moving points) independently in the Z-direction. Further it is so designed that said moving points are approximately positioned on said reference plane when said driving points are in a predetermined neutral state, for example at the center of a moving stroke in the Z-direction.

Furthermore, in a preferred embodiment, the reference plane is made to coincide approximately with the surface of the wafer placed on the levelling stage and with the image plane of the reticle pattern through the projection optical system.

In the above-explained structure, the lateral aberration of the wafer when the levelling stage is inclined is limited to the cosine error component, so that for example the different in the lateral aberration between a peripheral exposure area and a central exposure area in a wafer can be considered negligible. Consequently it is possible to achieve exposure without affecting the accuracy of alignment, regardless of the position of the exposure area on the wafer, by a levelling operation according to the amount of inclination detected by the levelling sensor. This is true not only for the levelling for each exposure, or so-called each-short levelling, but also for the levelling of the entire wafer, or so-called global levelling.

BRIEF DESCRIPTION OF THE DRAWINGS

FIG. 3 is a schematic cross-sectional view of a wafer;

FIG. 4 is a perspective view of a support mechanism with a plate spring; and

FIG. 5 is a perspective view showing the structure of a nut and a lead screw.

DESCRIPTION OF THE PREFERRED EMBODIMENTS

Figure 1:
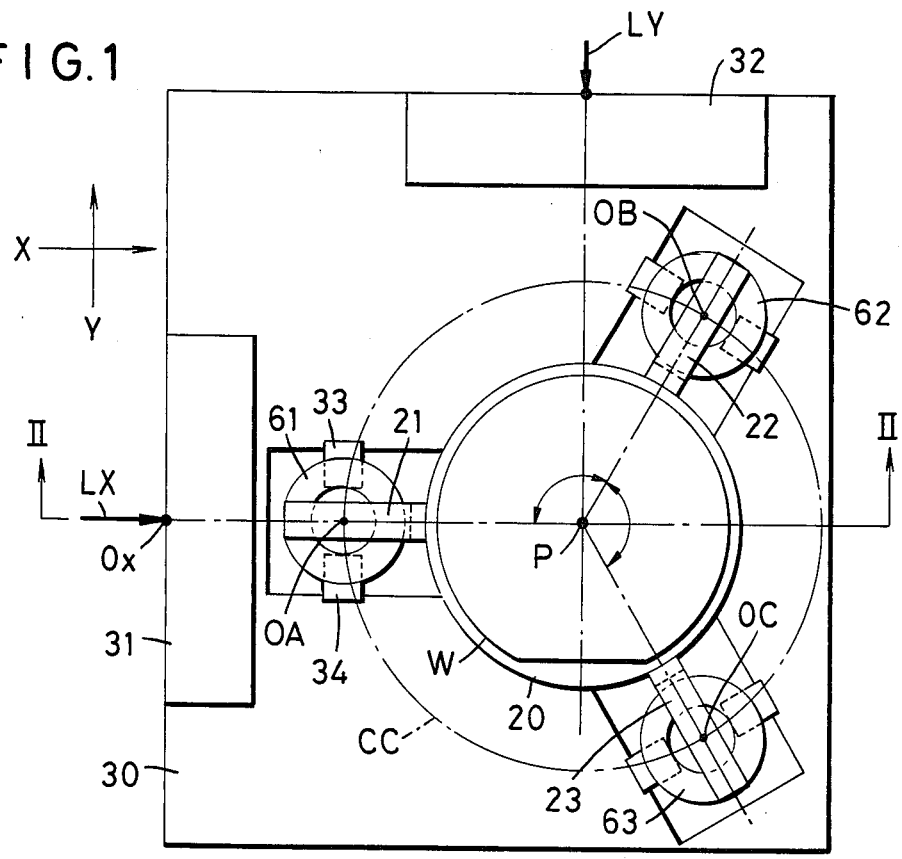
FIG. 1 is a plan view of a stage device embodying the present invention.
Figure 2:
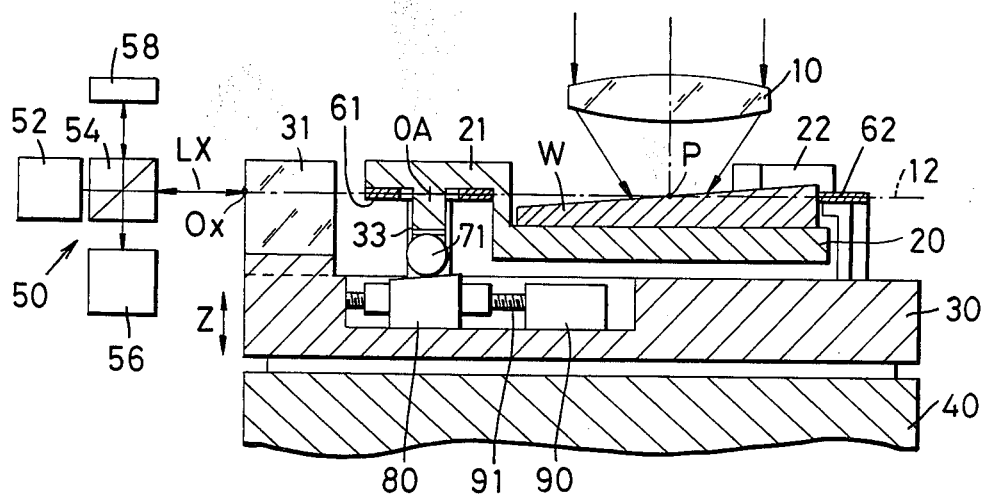
FIG. 2 is a cross-sectional view along a line II—II shown in FIG. 1.

The stage device shown in FIGS. 1 and 2 is adapted for use in a stepper, and there is provided a projection lens 10 of which optical axis is perpendicular to the XY-moving plane of the stage. The image plane, on which the image of the pattern of reticle (not shown) is projected by the projection lens 10, coincides with a predetermined reference plane 12 which is parallel to the XY-plane. The wafer W to be exposed is supported, by means of an unrepresented wafer chuck, on a levelling stage which can be inclined in an arbitrary direction with respect to the reference plane 12. The levelling stage 20 is provided on a Z-stage 30, which is in turn provided on an XY-stage 40 movable in the X- and Y-direction along the reference plane 12. The Z-stage 30 is constructed movable only in the Z-direction (axial direction of the projection lens) with respect to the XY-stage 40, and is provided, at an end thereof, with a flat mirror 31 for a laser interferometer 50 in the X-direction. The reflecting surface of the mirror 31 is perpendicular to the reference plane 12, and a point $0_x$ on the reflecting surface is positioned in the reference plane 12. A laser beam from the laser interferometer is projected through said point $0_x$ and perpendicularly to said reflecting surface. The center of said laser beam constitutes a measuring axis LX of the stage in the X-direction. The laser interferometer 50 is provided with a laser unit 52, a beam splitter 54 and a detector 56. Interference is caused by synthesizing the reflected beam from a fixed mirror 58 and that from the flat mirror 31, and the changes in fringes is counted by the detector 56. Another interferometer is provided for the measurement in the Y-direction, with a measuring axis LY which is perpendicular to the reflecting surface, extending in the X-direction, of a flat mirror 32. The measuring axes LX and LY perpendicularly cross each other at a point P, which is positioned on the optical axis of the projection lens. FIGS. 1 and 2 illustrate a state in which the center of the wafer W is positioned at said point P. It is assumed, as shown in FIG. 3, that the wafer W has an unevenness t in thickness due to a tolerance in the manufacture.

The levelling stage 20 is provided with three radial integral arms 21, 22, 23 which are positioned at an angular interval of ca. 120° with respect to the center of wafer on the levelling stage 20. Under said three arms there are respectively provided identical annular flat springs 61, 62, 63 approximately in the reference plane 12. The circular form of said flat springs 61, 62, 63 is not essential, but is preferable for satisfactory symmetry of elastic deformation. As shown in FIG. 4, the flat spring 61 is fixed with screws, at points a, b mutually apart by 180°, to the arm 21. Also at two points c, d which are distant from said points a, b by about 90°, the flat spring 61 is fixed with screws to fixed members 33, 34 integral with the Z-stage 30. The structure is same for other flat springs 62, 63. Consequently the levelling stage 20 is supported on the Z-stage 30 through three flat springs 61, 62, 63. A neutral state is defined when the centers OA, OB, OC of said plate springs are positioned on a circle CC of a distance from the center of the wafer and when said centers are positioned on the reference plane 12. In said neutral stage, the wafer supporting plane of the wafer chuck (or the chuck supporting plane on the levelling stage) is adjusted parallel to the reference plane 12.

Under the arm 21 there is provided, passing through the center hole of the flat spring 61, a bearing arm 70 rotatably supporting a radial roller bearing 71 at the lower end. Said roller bearing 71 is maintained in contact with a tapered face 81 of a nut 80, shown in FIG. 5, which engages with a lead screw 91 rotated by a motor 90 which is fixed on the Z-stage 30. The rotation of the motor 90 displaces said nut in the axial direction of the lead screw 91, thereby varying the contact position of the bearing 71 and the tapered face 81 of the nut, whereby the bearing 71 is displaced in the Z-direction. Said neutral state is defined at the center of the movable stroke of said bearing 91 in the Z-direction. Identical structures are provided also for other two arms 22, 23. Between the levelling stage 20 and the Z-stage 40 there is provided an unrepresented--spring for pressing the bearing 71 against the tapered face 81. Consequently the levelling stage 20 can be inclined in an arbitrary direction by activating three motors.

The flat springs 61, 62, 63 can deform elastically in the Z-direction but do not show any deformation in the X- and Y-directions. Also since three flat springs are uniformly distributed around the levelling stage, the center of the wafer W does not show any lateral displacement in the levelling operation. The centers OA, OB, OC of deformation of said three flat springs do not displace in the reference plane 12 as the result of the levelling operation, but are slightly displaced in the Z-direction from the reference plane 12. In case of a levelling operation for correcting an inclination $\theta$ of the surface of the wafer W with respect to the image plane of the projection lens 10, the aberration of the surface of the wafer W with respect to the XY-coordinate system defined by the laser interferometer is represented as a function of the cosine component of the inclination angle $\theta$.

In the above-explained structure, it is also necessary to consider a fact that, as shown in FIG. 3, the thickness of the wafer W has a fluctuation t due to the tolerance in the manufacture. For this reason the reference plane 12 is selected in advance at the center of said fluctuation, or t/2. Thus, in case of detecting the height of wafer surface at the point P by means of an off-axis focus sensor or a levelling sensor as disclosed in the U.S. Pat. No. 4,558,949 and servo-controlling the Z-stage in the Z-direction in such a manner that the image plane coincides with the wafer surface, the centers OA, OB, OC of deformation of the flat springs 61, 62, 63 may be displaced by t/2 at maximum in the Z-direction from the reference plane 12. Therefore, in case of levelling correction of the inclination angle $\theta$, the maximum lateral displacement of the wafer in the XY-coordinate system is $t/2 \cdot \sin\theta$.

In the levelling mechanism of the present embodiment, therefore, the lateral displacement of the wafer at the levelling operation can be disregarded if the cosine error and the sine error are selected below the minimum readable value of the laser interferometer.

In the following there will be calculated the cosine error $\Delta C_0$ for a resolving power of 0.02 $\mu$m of the laser interferometer. Said cosine error is defined by:

$$\Delta C_0 \approx L(1 \mp \cos\theta) \leq 0.02 \ \mu m$$

wherein L is the distance from the center OA of deformation of the flat spring 61 to the farthest exposure point on the wafer. Said distance L is dependent on the wafer size but is about 200 mm in case of 6-inch wafer. Consequently the maximum inclination angle is $\theta \cong 1.5'$ for satisfying the condition $\Delta C_0 \leqq 0.02 \ \mu m$.

On the other hand, the sine error $\Delta Si$ resulting from the fluctuation t in the wafer thickness is represented by:

$$\Delta Si \cong t/2 \cdot \sin\theta \leqq 0.02 \ \mu m.$$

Since the fluctuation t is in the order of 50 $\mu m$ for a 6-inch wafer, the maximum inclination angle is $\theta \cong 2.7'$ for satisfying the condition $\Delta Si \leqq 0.02 \ \mu m$.

Thus, if the range of each levelling is selected up to $\theta = 1.2'$ in consideration of the sine and cosine errors with a margin, the levelling correction can be made up to an inclination corresponding to a difference of 7 $\mu m$ on both sides of an exposure area of 20 mm in diameter.

In the above-explained levelling mechanism the motion points of the levelling stage 20 are the centers OA, OB, OC of deformation of the flat springs 61, 62, 63 and the designed to coincide with the reference plane 12 in the neutral state. Consequently the inclination angle $\theta$ for maintaining the lateral abberration of the wafer at the levelling operation below a predetermined limit is predominantly determined by the cosine error, and the range of angle $\theta$ can be selected large. Thus, even when the flatness of the wafer is deteriorated, the exposure can be executed always with optimum resolution, through an open loop servo control of the inclination of the levelling stage according to a detection signal from the levelling sensor disclosed in the U.S. Pat. No. 4,558,949.

In the structure shown in FIG. 1, the mirror 31 of the laser interferometer 50 for X-direction may also be provided at the right-hand end of the Z-stage 30 for reducing the size of the Z-stage in the X-direction and reducing the weight thereof.

What is claimed is:

1. A stage device comprising:
   an XY-stage movable in a plane parallel to a reference plane;
   a Z-stage provided on said XY-stage and rendered movable in a direction substantially perpendicular to said reference plane;
   a levelling stage provided on said Z-stage and adapted for supporting a workpiece in such a manner that the surface thereof approximately coincides with said reference plane;
   drive means for displacing said levelling stage at plural points defined thereon independently in a direction substantially perpendicular to said reference plane thereby regulating the inclination of the surface of said workpiece with respect to said reference plane, wherein each of said plural points is so positioned as to lie on said reference plane when displaced to a neutral position by said drive means; and
   measuring means having measuring axes on said reference plane and adapted to measure the position of said workpiece on said measuring axes.

2. A stage device according to claim 1, wherein said measuring means comprises a reflecting surface provided on said Z-stage perpendicularly to said measuring axis, and an interferometer provided with means for emitting a light beam proceeding along said measuring axis toward said reflecting surface.

3. A stage device according to claim 1, wherein said drive means comprises means for suppressing the displacement of said levelling stage in the direction of said reference plane with respect to said Z-stage.

4. A stage device according to claim 3, wherein said suppressing means comprises plural elastic members provided respectively corresponding to said plural points, wherein each of said elastic members is provided between said Z-stage and the levelling stage and has a high rigidity in a direction parallel to said reference plane but has an elasticity in a direction perpendicular to said reference plane.

5. A stage device according to claim 4, wherein each of said elastic members has a center of deformation substantially corresponding to one of said plural points.

6. A stage device according to claim 5, wherein each of said elastic members comprises a flat spring positioned along said reference plane and having a central aperture, wherein said flat spring is fixed to said Z-stage at two positions symmetrical to the center of said flat spring and is fixed to said levelling stage at other two points.

* * * * *